US010958265B1

(12) United States Patent
Sullivan

(10) Patent No.: US 10,958,265 B1
(45) Date of Patent: Mar. 23, 2021

(54) WINCH MOTOR PROTECTION CIRCUIT

(71) Applicant: InPower LLC, Galena, OH (US)

(72) Inventor: James D. Sullivan, Galena, OH (US)

(73) Assignee: InPower LLC, Lewis Center, OH (US)

( * ) Notice: Subject to any disclaimer, the term of this patent is extended or adjusted under 35 U.S.C. 154(b) by 0 days.

(21) Appl. No.: 16/736,397

(22) Filed: Jan. 7, 2020

(51) Int. Cl.
| H02H 3/087 | (2006.01) |
| H03K 17/082 | (2006.01) |
| B66D 1/48 | (2006.01) |
| H01L 27/02 | (2006.01) |
| H02H 3/00 | (2006.01) |
| H02H 7/08 | (2006.01) |
| G01R 31/00 | (2006.01) |
| H02P 27/06 | (2006.01) |
| H02J 7/00 | (2006.01) |

(52) U.S. Cl.
CPC ......... *H03K 17/0822* (2013.01); *B66D 1/485* (2013.01); *H01L 27/0274* (2013.01); *H02H 3/087* (2013.01); *G01R 31/006* (2013.01); *H02H 3/00* (2013.01); *H02H 7/08* (2013.01); *H02J 7/00* (2013.01); *H02P 27/06* (2013.01)

(58) Field of Classification Search
USPC .............................. 361/23, 86–88, 93.7–93.9
See application file for complete search history.

(56) References Cited

U.S. PATENT DOCUMENTS

| 4,873,474 A | 10/1989 | Johnson |
| 5,214,359 A | 5/1993 | Herndon et al. |
| 5,648,887 A | 7/1997 | Herndon et al. |
| 5,969,919 A * | 10/1999 | Kobayashi ........... B62D 5/0484 318/281 |
| 6,046,893 A | 4/2000 | Heravi |
| 7,408,274 B2 | 8/2008 | Sullivan et al. |
| 8,076,885 B2 | 12/2011 | Heravi et al. |
| 2010/0079093 A1 * | 4/2010 | Kitanaka .............. H02H 7/0838 318/400.3 |

OTHER PUBLICATIONS

Sensefet Power MOSFET [online] product specification May 2012 [retrieved Apr. 16, 2020] retrieved from https://datasheet.octopart.com/NTMFS4833NST1G-ON-Semiconductor-datasheet-99556626.pdf.

(Continued)

*Primary Examiner* — Danny Nguyen
(74) *Attorney, Agent, or Firm* — Frank H. Foster; Kremblas & Foster

(57) ABSTRACT

A protection circuit for protecting a load, such as a winch motor, from an overcurrent as well as from a circuit fault including welded primary switch contacts and a failure of its MOS/FET component. A power MOS/FET is used as a current mirror for sensing load current. A secondary switch is series connected to control the primary switch. A control circuit including a programmable data processor controls the MOS/FET and the secondary switch and senses the current through the MOS/FET's secondary source terminal and senses the voltage at its primary source terminal. The programmable data processor determines whether an overcurrent exists by comparing the sensed power circuit current to a stored overcurrent value and also senses whether the contacts of the primary switch are welded closed and whether the MOS/FET has been damaged. Additional conditions are sensed. Application of power to the load is prevented when such conditions are detected.

10 Claims, 4 Drawing Sheets

(56) References Cited

OTHER PUBLICATIONS

Power MOSFET [online] product specification May 2017 [retrieved Apr. 16, 2016] retrieved from https://www.onsemi.com/pub/Collateral/NTMFS4833NS-D.PDF.
UM1556 User Manual [online] product user manual Sep. 2013 [retrieved Apr. 16, 2020] retrieved from www.st.com, pp. 1, 24-28.

* cited by examiner

WINCH MOTOR PROTECTION CIRCUIT

BACKGROUND OF THE INVENTION

This invention relates to an electrical protection circuit for protecting the circuit components in a power circuit that has an electrical load driven by an electrical power source and controlled by one or more switches for switching load current on and off. More particularly the invention is directed to such a protection circuit in the power circuit of a dc motor driving a winch. The protection circuit senses the power circuit current in an accurate, temperature independent manner and also senses other circuit parameters and uses the sensed parameters to control circuit switches.

The basic components of a dc motor circuit are a power source, such as a battery, the dc motor and at least one switch in series connection with the motor and power source. Battery powered dc motors that drive a high mechanical load require a large armature current in order to provide the necessary power from the relatively low voltages provided by batteries. Consequently, the large armature current is commonly switched by mechanical relays, often called contactors, that are designed to handle large currents and are controlled by relatively small voltages and currents. There may be only one contactor for motors that are driven in only one direction of rotation or there may be multiple contactors for reversing the motor direction in addition to turning the motor on and off.

Motor circuits of the above type are used for driving a winch, such as the winches used on ATVs. The prior art has provided winch control modules, also known as winch controllers, for controlling a series wound dc motor that drives a winch. The dc motor has an armature winding and a stator winding. When the voltage applied to one of them is reversed, the motor rotation direction is reversed to allow the winch cable to be wound onto or unwound from the winch by the operator. A bi-directional, manually operated switch is used by the operator to retract or extend the winch cable. The manual switch is connected to the controller circuit. A reversing relay is also connected to the controller for handling the high motor currents and is switched by the controller in response to the switched state of the manual switch. Relays, such as the reversing relays, are mechanical relays manufactured with a current rating from a few amps to thousands of amps. Their duty cycle is short; that is, they have relatively few cycles of operation in their life expectancy because they arc and their contact surfaces corrode and wear. But on an ATV they are not used often so the mechanical relay contactors are practical for ATVs.

As with all electrical motors, load current is a function of mechanical load. However, a user may mechanically overload the winch thereby drawing an excessively high, and therefore destructive, overcurrent. For example, an overcurrent is likely if a user tries to pull an ATV up a grade that is too steep or the ATV is stuck on a rock or log and the dc motor does not have enough power to move the ATV away from its stuck position. In that situation, the dc motor is unable to rotate so it presents an electrical load that is essentially a dead short resulting in a high electrical overload current.

In order to prevent the mechanical overload, a pulley arrangement could be used to provide a mechanical advantage so that the force applied to the ATV in order to move it can exceed the maximum force at which the winch is rated. But hardware associated with such a pulley arrangement, such as a winch mounting bracket, may be rated only slightly higher than the maximum force rating of the winch. So using a pulley system for its mechanical advantage can cause the mounting bracket or other mechanical components on the ATV to break.

To solve the problem of an overload current resulting from a mechanical overload of the winch motor, the prior art uses a variety of different current-sensing circuit elements in the motor power circuit that directly sense the motor current flowing through them. The sensed value of motor current through the current-sensing circuit element is applied to a controller which in turn controls the contactor or contactors that switch the motor current. The manual control switch that is operated by the user is also connected to the controller.

One prior art way of sensing motor current is to insert a small resistance in series within the motor circuit and detect the current by monitoring the voltage across the series resistance. The winch motor controller senses the winch motor load current and, if the current exceeds a selected maximum load current, the controller opens the mechanical contactor or contactors that switch the motor on and off. However, the currents for a modern winch motor are so large, often hundreds of amps, that inserting a resistance in series with the motor creates problems because of the resulting excessive voltage drop and power dissipation. The problems include wasting energy and inaccuracy introduced by the temperature dependence of the resistance.

A prior art solution to the problem of sensing motor current using a series resistance is to substitute a Hall effect transducer for the series resistance current sensing circuit in order to monitor the winch motor load current. The amount of current that flows across a Hall effect device is a function of the product of the voltage applied to the device and the magnetic field produced by the load current. A current sensor using a Hall effect device is calibrated by modulating the voltage applied to it because increasing or decreasing the voltage increases or decreases the output level that represents the sensed current. The voltage is modulated to a value so that, when the motor current through the Hall effect device equals or exceeds the value of motor current that is chosen as the overload current, the controller will trip open the contactor. The sensed output from the Hall effect device is related to the actual motor current through it by a proportionality constant. However, that proportionality constant in a Hall effect device varies with temperature which can introduce significant error.

Yet another solution is to measure the voltage drop across a segment of the cable connecting the battery to the motor. Even its small resistance could have a usable voltage drop across it. But, because the cable is still a series resistance in the high current motor circuit, this solution is also subject to the inaccuracy arising from the temperature dependence of the cable resistance.

Still another solution was essentially a power meter. This solution sensed the motor voltage and the motor current and derived the product of the two. But power consumed by the motor and the current through the motor are very different parameters. The power consumed by the motor can be relatively low when the motor cannot rotate because of mechanical overload but at the same time the motor can be experiencing excessive current because the motor is a dead short.

All of these prior art solutions directly monitor, in various ways, the current that is going through the motor which is the current of interest because it is the current that can destroy the motor or other circuit components.

An additional and significant problem that is inherent in these motor control circuits is that, because the mechanical relays carry high currents, they are susceptible to a failure mode in which the relay contacts weld together if the user mechanically overloads the winch thereby drawing an overcurrent. The overload current causes excessive heat to be dissipated at the interfacing relay contact surfaces causing them to weld together. When its contacts become welded together, an on/off or reversing switch cannot open the circuit and shut off the current. The user has to find another way to open the electrical circuit, for example unbolt a battery cable. Because this takes substantial time, the winch motor often burns out and is destroyed.

There also are several other undesirable conditions from which it is desirable to provide protection. To add that additional protection, the prior art inserts separate additional other circuits that each sense other parameters and respond to provide the desired protection for the undesirable condition that they are monitoring.

It is an object and purpose of the invention to provide an improved, highly precise and stable manner of sensing the motor circuit current in order to detect an overcurrent condition yet to do so in a manner that avoids the problems that arise from monitoring a series resistance in the motor power circuit, avoids the temperature related inaccuracy of a Hall effect device and avoids the inaccuracy that results from detecting power.

Another object and feature of the invention is to provide circuit protection in the event that the contacts of a contactor become welded together in a closed circuit state.

BRIEF SUMMARY OF THE INVENTION

The invention is a protection circuit for protecting a load, such as a winch motor, from an overcurrent as well as protecting the circuit from a circuit component fault including the welded contacts of a primary contactor switch and a failure of its MOS/FET component. A power MOS/FET is used as a current mirror circuit and has its secondary source connected to a current sensing circuit and has its drain and its primary source connecting its primary group of MOS/FETs in series in the power circuit of the load. A secondary switch, preferably a relay K1, is series connected to control the primary switch. A control circuit, including a programmable data processor, controls the MOS/FET and the secondary switch. The programmable data processor also senses the current through the MOS/FET's secondary source terminal and the voltage at its primary source terminal. The programmable data processor determines whether an overcurrent exists by comparing the sensed power circuit current to a stored overcurrent value and also detects whether the contacts of the primary switch are welded closed and whether the MOS/FET has been damaged. Additional potentially damaging or dangerous conditions are also detected and application of power to the load is prevented when such a condition is detected.

Figure 1:
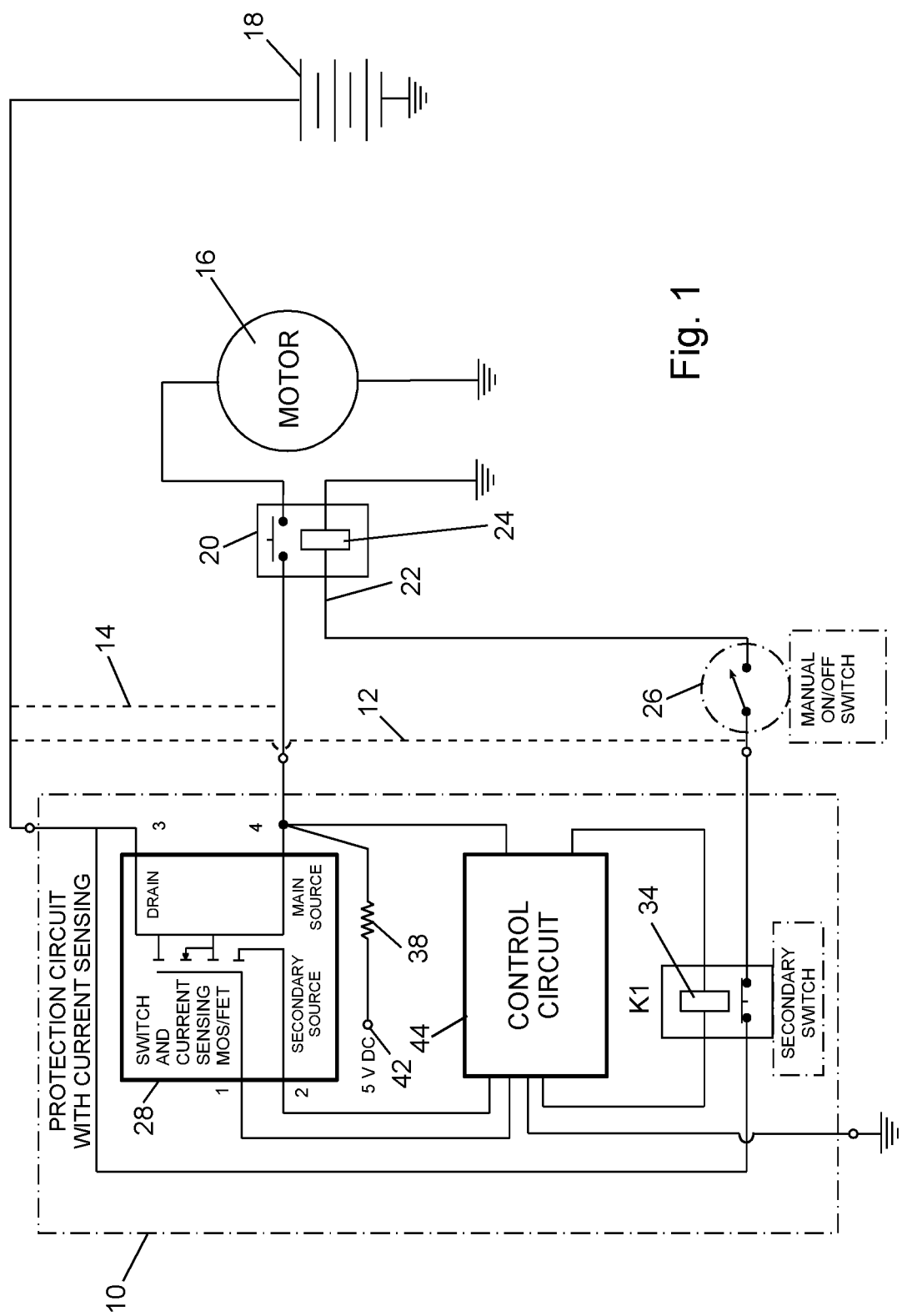
FIG. 1 is a schematic diagram of an embodiment of the invention for protecting a simple load from an overcurrent.

In describing the preferred embodiment of the invention which is illustrated in the drawings, specific terminology will be resorted to for the sake of clarity. However, it is not intended that the invention be limited to the specific term so selected and it is to be understood that each specific term includes all technical equivalents which operate in a similar manner to accomplish a similar purpose. For example, the word connected or terms similar thereto are often used. They are not limited to direct connection, but include connection through other circuit elements where such connection is recognized as being equivalent by those skilled in the art. In addition, many circuits are illustrated which are of a type which perform well known operations on electronic signals. Those skilled in the art will recognize that there are many, and in the future may be additional, alternative circuits which are recognized as equivalent because they provide the same operations on the signals.

DETAILED DESCRIPTION OF THE INVENTION

Circuit Structure

Figure 2:
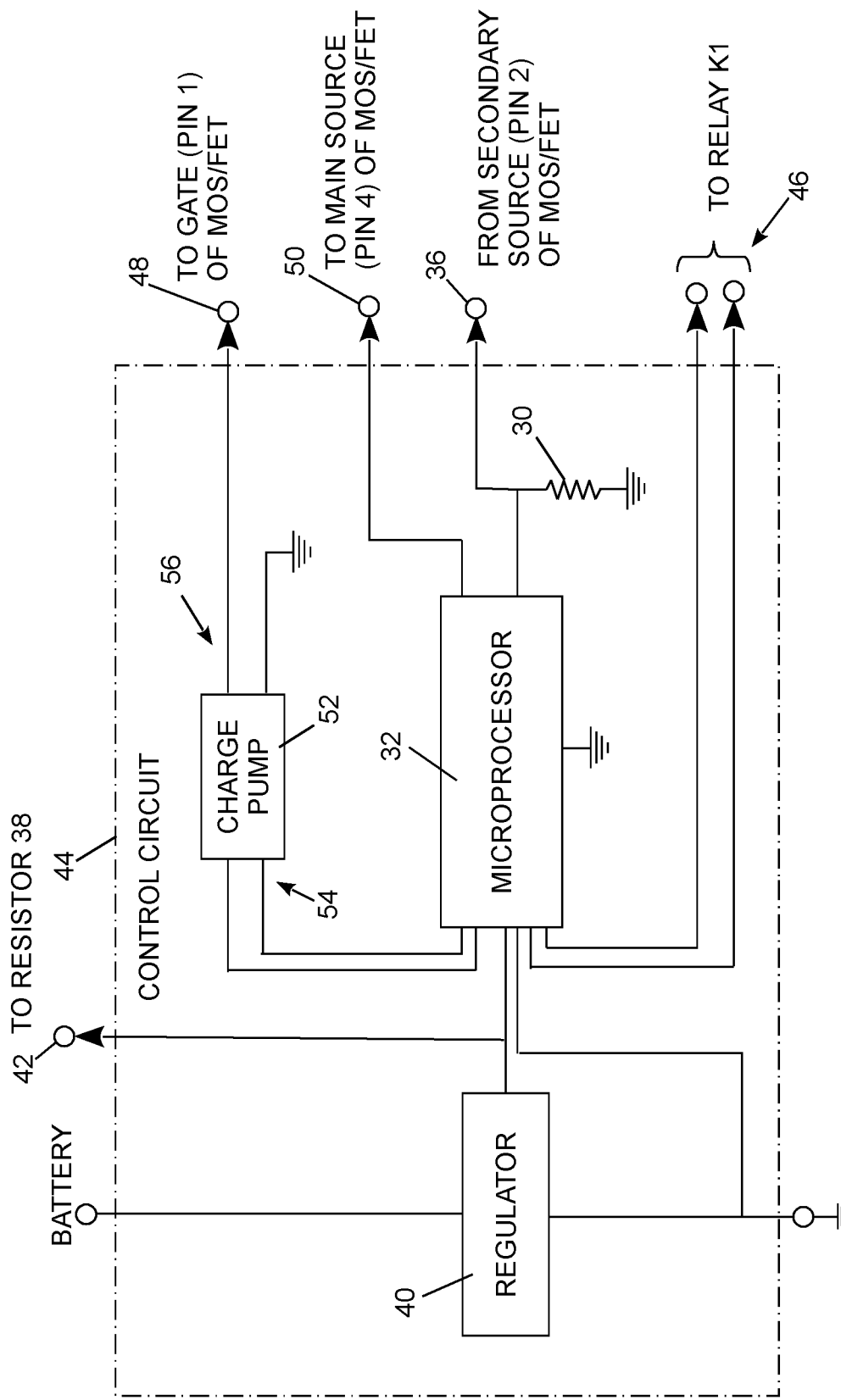
FIG. 2 is a schematic diagram of the control circuit portion of the preferred embodiment of the invention.
Figure 3:
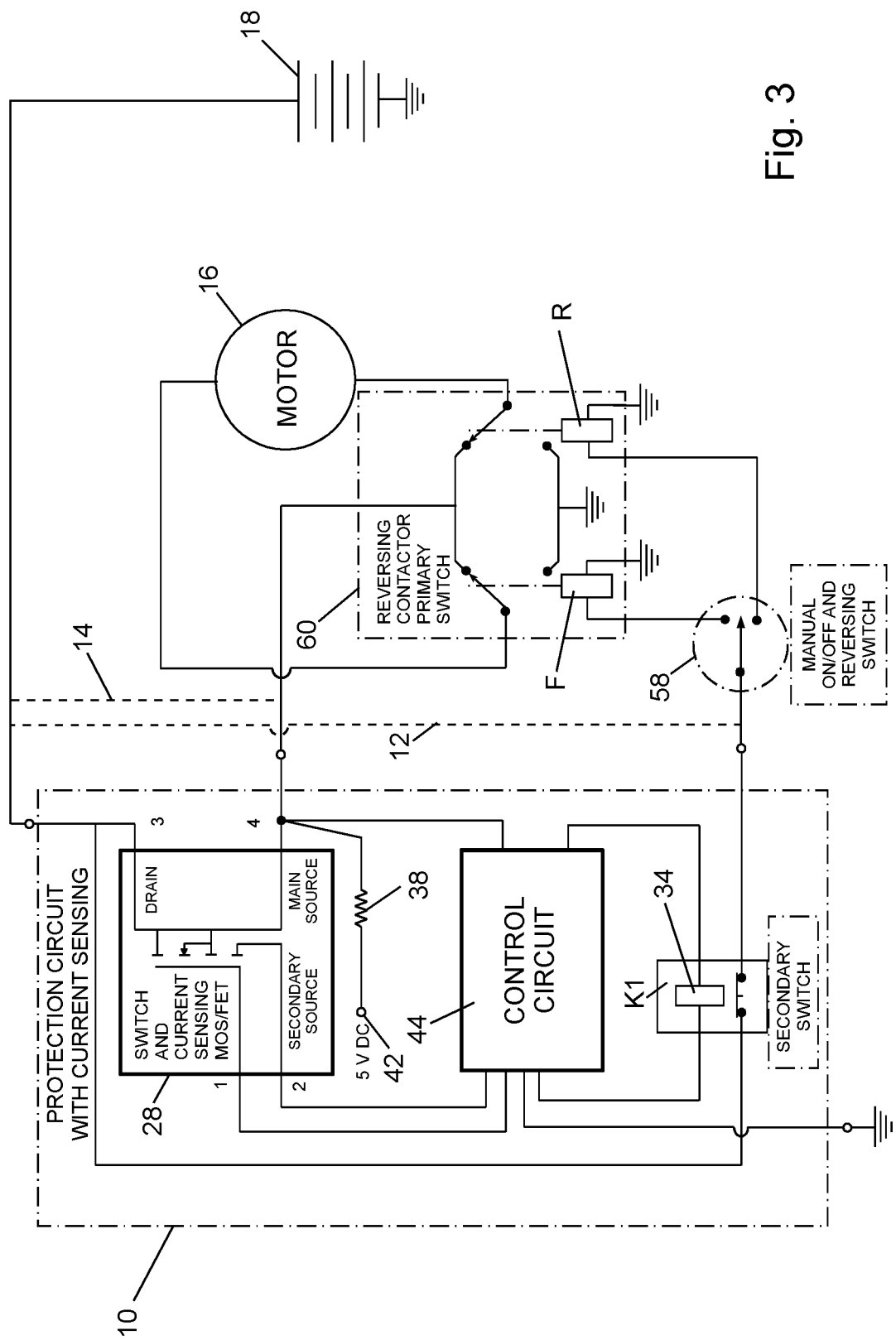
FIG. 3 is a schematic diagram of the preferred embodiment of the invention for protecting a reversible dc motor, such as used for a winch, from an overcurrent.

FIG. 1 illustrates an embodiment of the invention applied to a power circuit in which the electrical load is a dc motor controlled by a primary contactor that allows the motor to rotate in only one direction. FIG. 3 illustrates the same circuit except that the dc motor is reversible for operation in both directions of rotation and therefore is more practical for winch applications. FIG. 2 illustrates an embodiment of a control circuit of the invention and is used in the embodiments of both FIG. 1 and FIG. 3.

Referring to both FIG. 1 and FIG. 3, an embodiment of the invention is a protection circuit 10 (outlined in phantom lines). The protection circuit 10 is identical in the embodiments illustrated in both FIG. 1 and FIG. 3. The protection circuit 10 is connected to the components of a typical basic conventional motor power circuit for the winch of an ATV or other vehicle. The term "power circuit" is used to refer to the circuit loop that carries the current through the motor armature or other load. In a basic, conventional prior art arrangement, the protection circuit 10 of the invention is absent and instead the conventional basic motor power circuit is connected by the conduction paths 12 and 14 shown in dashed lines. However, with the invention, the conduction paths 12 and 14 are omitted and an embodiment of the invention is connected to them as illustrated in FIGS. 1 and 3.

In FIG. 1 the power circuit includes a dc motor 16 as an electrical load in series connection with a dc power source, such as battery 18, and a primary switch 20 for controlling the current through the dc motor 16. The preferred and typical primary switch is a mechanical relay 20 of the type that is commonly also known as a contactor. A contactor is used because of its ability to switch the high currents that are typically drawn by low voltage dc motors. The primary relay 20 has an electrically controlled input 22 to its coil 24 for switching the primary relay 20 between its ON state (conducting) and its OFF state (non-conducting). A manually operated ON/OFF switch 26 is connected in series to the electrically controlled input 22 of the primary relay 20 to permit an operator to manually turn the motor 16 on and off.

The protection circuit 10 of the invention includes a power MOS/FET 28. A power MOS/FET is actually thousands of tiny MOS/FETs connected in parallel with each tiny MOS/FET carrying a very small proportion of the total current. However, the MOS/FET is able to carry a large current that is the sum of the individual currents through each of the tiny MOS/FETs. A power MOS/FET of the type used in the invention allows the option of connecting together some of the sources to define one group of MOS/FETs and connecting other sources together to define another group of MOS/FETs. The gates of all the tiny MOS/FETs are connected together to form one gate terminal and the drains of all the tiny MOS/FETs are connected together to form one drain terminal. All the tiny MOS/FETs are controlled at the single gate terminal.

As an illustrative example, if there are 1010 of the tiny MOS/FETs, 1000 of those MOS/FETs can have all their sources connected together as a main source terminal of a main group of MOS/FETs and 10 of those tiny MOS/FETs can have all their sources connected together as a secondary source terminal of a secondary group of MOS/FETs. This described connection results in a current mirror circuit.

Although each one of the thousands of the tiny MOS/FETs may have a source to drain resistance of, for example, 1 ohm, because they are connected in parallel their total resistance is considerably less. For example the above main group of 1000 parallel MOS/FETs at 1 ohm each would have a total resistance of 0.001 ohm and the secondary group of 10 parallel MOS/FETs would have a resistance of 0.01 ohm. If a power MOS/FET configured in such a current mirror configuration is used and motor current is passed through the main group of MOS/FETs, the current through the secondary group of MOS/FETs is always proportional to the current through the main group. If 1000 amps of current is flowing through the main group, the current through the secondary group will be 10 amps. This allows the motor current to be sensed in a highly accurate manner without any effect upon the actual motor current itself. Although the above example has a proportionality constant of 100, the actual proportionality constants of real and practical circuits are on the order of 100, 500 or 35,000. This circuit not only provides a new way to monitor motor load current but provides additional accuracy advantages. One advantage is that the proportionality constant does not vary with temperature.

Referring again to FIGS. 1 and 3, the protection circuit 10 of the invention includes the power MOS/FET 28 which has a main group of parallel connected MOS/FETs and a secondary group of parallel connected MOS/FETs. The gates in the two groups are connected together to provide a MOS/FET gate terminal (pin 1) and the drains in the two groups are connected together to provide a MOS/FET drain terminal (pin 3). The sources of the main group are connected together to provide a main source terminal (pin 4) and the sources of the secondary group are connected together to provide a secondary source terminal (pin 2). The main group of parallel connected MOS/FETs is connected in series in the power circuit at the main group source terminal (pin 4) and the main group drain terminal (pin 3). As described above, the number of parallel connected MOS/FETs in the main group is greater than the number of parallel connected MOS/FETs in the secondary group by a proportionality constant that is greater than 1.

A current sensing circuit is connected to the sources (pin 2) of the secondary group of parallel connected MOS/FETs for the purpose of sensing the current that is proportional to the motor load current. The preferred current sensing circuit (FIG. 2) has a voltage dropping resistor 30 in series with the secondary group of MOS/FETs and connected between the secondary source terminal (pin 2) and a common ground. The current through the resistor 30 causes a voltage drop across the resistor 30 that is proportional to the load current through the main group of MOS/FETs. The secondary source terminal (pin 2) is also connected to an input 36 to a programmable data processor, preferably a microprocessor 32, which includes an on-board analog to digital (A/D) converter for converting the analog voltage across the voltage dropping resistor 30 to digital data representing a sensed load current value.

A secondary switch K1 is interposed in series connection between the battery 18 power source and the electrically controlled input 22 of the primary switch 20. The secondary switch K1 has an electrically controlled input to its actuating coil 34 for switching the secondary switch K1 between its ON state and its OFF state. Outputs from the microprocessor 32 (FIG. 2) are connected to the electrically controlled input of the actuating coil 34 for turning the secondary switch K1 on and off under the command of the microprocessor 32.

The reason for the interposed secondary switch, which is relay K1, is to isolate the sense circuit and the control circuit 44 from the battery voltage. This allows the protection circuit of the invention to be used with battery systems over a wide range of battery voltages. For any practical battery system voltage, the regulator supplies the same output voltage, for example 5 volts, for operating the microprocessor and the entire control circuit 44. This isolation means that the circuit can control hundreds of amps and hundreds of volts all with the same protection circuit.

A current limiting resistor 38 connects a reference voltage source to the main source terminal (pin 4) for the purpose of applying a reference voltage to the main source terminal (pin 4). This reference voltage is for testing the state of components of the power circuit in a manner that will be described below. The source of the reference voltage can conveniently be a regulated power source that supplies power to the microprocessor 32. As seen in FIG. 2, the battery 18 supplies power through a regulator 40 to the microprocessor 32 at a regulated constant voltage, such as 5 volts, regardless of the voltage of the battery 18. That same regulated voltage can be used as the reference voltage and applied at terminal 42 to resistor 38.

Control of the primary switch 20, the secondary switch K1 and the MOS/FET 28, as well as processing of the sensed values of voltage and current, are performed by the control circuit 44 illustrated in FIG. 2. The control circuit 44 includes the microprocessor 32 which has a current-sensing input 36 from the sources (pin 2) of the secondary group of MOS/FETs, an output 46 to the coil 34 of the secondary switch K1, an output 48 to the gate (pin 1) of the MOS/FET 28 and an input 50 from the main source (pin 4) to the microprocessor 32 for sensing the voltage at the main source (pin 4).

A charge pump 52 has its input 54 connected to the microprocessor 32 and its output 56 connected to the gate (pin 1) of the MOS/FET 28 for applying a voltage to the gate (pin 1) to turn the MOS/FET 28 fully ON or fully OFF under command of the microprocessor 32. The charge pump is controlled by the microprocessor 32 and is totally isolated from the power source dc voltage of the battery 18 by its capacitors. So the charge pump both provides dc isolation of the gate of the MOS/FET from the power source and also, under control of the microprocessor, applies the required voltage levels to the gate for turning the MOS/FET to a fully ON state and a fully OFF state regardless of the voltage of the battery 18.

The microprocessor 32, or other programmable data processor, is programmed, among other things, to initially apply a voltage to the gate (pin 1) to bring the power MOS/FET 28 to a fully non-conducting OFF state, to then sense the voltage at the sources (pin 4) of the main group of parallel connected MOS/FETs and to apply a voltage to the gates (pin 1) to bring the power MOS/FET to a fully conducting state only if the voltage sensed at the sources (pin 4) of the main group of parallel connected MOS/FETs is the reference voltage.

The microprocessor 32, or other programmable data processor, is also programmed to, among other things, (1) apply a voltage to the gate (pin 1) of the MOS/FET 28 that brings the MOS/FET 28 to its fully conducting ON state, (2) then apply a voltage to the coil 34 of the secondary switch K1 that opens the secondary switch K1 if and when the current through the resistor 30 of the current sensing circuit exceeds a value that represents a selected value of overcurrent and (3) to apply a shut off voltage to the gate (pin 1) of the MOS/FET 28 to open circuit the MOS/FET 28 if, after the voltage that opens the secondary switch K1 is applied to the coil 34 of the secondary switch K1, an overcurrent is sensed by the current sensing circuit.

A circuit structure that embodies the invention has been described with reference to FIGS. 1 and 2. The circuit of FIG. 3 differs from the circuit of FIG. 1 only with respect to the manual control switch 58 and the primary switch 60. However the embodiment of FIG. 3 is shown because it provides motor reversing so it is practical for a winch. In FIG. 3, the manual control switch 58 is a manual on/off and reversing switch 58 that allows the user to switch the motor off, run the motor in one direction of rotation or run the motor in the opposite direction of rotation. The primary switch 60 is a pair of contactors, one contactor having an actuating coil F for running the motor 16 in a forward direction and another contactor having an actuating coil R for running the motor 16 in a reverse direction. The positioning of the manual control switch 58 by the user determines whether power is applied to actuate the coil F, the coil R or neither. The secondary switch K1 of the protection circuit of the invention is in FIG. 3, as in FIG. 1, connected to control the application of power to the manual control switch 58 and therefore the controlling inputs to the primary switch 60.

Operation

As will be seen from the following description of the operation, unlike its use in the prior art, the MOS/FET as applied in the invention is never used to modulate the load current. Similarly, the MOS/FET is not used to shut off the load current in the absence of a circuit fault during normal operation of the motor by a user. In the invention the MOS/FET has two different functions. First, the MOS/FET is used to sense load current in the power circuit with the MOS/FET being maintained in its fully conducting ON state. Second, the MOS/FET can be used as a circuit breaker by being switched from its fully ON state to its fully OFF (open circuit) state in the event that the contacts of the main contactor 20 or 60 are welded together. Because the MOS/FET is always fully ON while sensing current, it has essentially 0 ohms between its drain and source so there is essentially no voltage across it. It can operate at any voltage or current that is likely to be encountered in the environment in which the circuit might be used without interposing a voltage dropping resistance in the power circuit for sensing power circuit current.

An initial safety check is performed whenever the protection circuit 10 is powered up after it was depowered, for example because it is being newly installed or the battery 18 or the protection circuit 28 was disconnected from the power circuit. The safety check addresses the possibility that the primary switch contactor 20 or 60 that controls the motor 16 could be welded closed as a result of a previous overcurrent problem. The safety check also addresses the possibility that the MOS/FET could have been damaged and become a short circuit between its drain and main source.

In order to detect such a circuit component failure, the microprocessor 32 is programmed to (1) apply a voltage to the gates (pin 1) that maintains the power MOS/FET in a fully non-conducting state, and (2) apply a voltage to the secondary switch K1 to open the switch K1. This provides an initial time delay interval for the safety check during which the condition of power circuit components is evaluated by the protection circuit. This evaluation can be performed in any time interval during which the MOS/FET is maintained in its fully non-conducting state and before the microprocessor 32 applies a voltage to the gates (pin 1) to bring the power MOS/FET to a fully conducting state.

During this initial safety check time interval, if the MOS/FET is not damaged, the MOS/FET is OFF; that is, open in its fully non-conducting state. With the MOS/FET in its OFF state, the control circuit senses the voltage at the sources (pin 4) of the main group of parallel connected MOS/FETs. If that sensed voltage is not substantially the reference voltage that is applied at terminal 42 through the current limiting resistor 38 to the main sources (pin 4), either the primary switch contactor 20 or 60 is welded closed or the MOS/FET has been damaged. The sensed voltage (at pin 4) will be the ground voltage (0 v) if contacts of the primary contactor 20 or 60 are welded closed, the motor 16 is not rotating and the MOS/FET is undamaged. The sensed voltage will be near the battery voltage if the MOS/FET has been damaged and is a short circuit, which is an unrecoverable fault. Consequently, if the sensed voltage at pin 4 is not the reference voltage, the protection circuit does not switch the MOS/FET to its ON state and further operation is delayed or postponed until the damaged component is replaced. More specifically, the step of applying a voltage to the gates to bring the power MOS/FET to a fully conducting state is delayed if the voltage sensed at the sources of the main group of parallel connected MOS/FETs is not the reference voltage. A person skilled in the art will recognize that the above operation is facilitated if the reference voltage is between 0 volts and the battery voltage and preferably approximately half the battery voltage.

If neither of the above component faults are detected, the microprocessor 32 applies a voltage to the gates (pin 1) that turns the MOS/FET ON in a fully conducting state. The microprocessor 32 also turns the secondary switch K1 to its ON state (closed). The preferred secondary switch K1 is a normally closed relay that is typically closed by applying no power or 0 volts to the coil 34 of switch K1. That now allows the manual switch 26 or 58 to control the motor contactor 20 or 60. If the MOS/FET in its ON state and the main switch contactor 20 or 60 closes properly when the manual switch is closed, the voltage at pin 4 is the battery voltage and current in the power circuit begins to flow through the motor and that current immediately begins to be sensed.

However, a characteristic of an electric motor is that, upon application of power to the motor, there is an initial inrush of a large motor current that declines as motor speed increases to a normal, steady state operating speed. To accommodate this large current, which can exceed the stored overcurrent trip value that is considered an overcurrent during normal, steady state operation, the microprocessor is programmed to delay tripping its overcurrent reaction process and instead perform an initial inrush process. With the microprocessor 32 monitoring the load current, the microprocessor control algorithm determines whether the sensed current exceeds a stored initial overcurrent trip value for more than a short time delay interval. For example, a sensed current that exceeds 275 amps for more than 500 msec can be considered an overcurrent that initiates the overcurrent reaction process. A lesser current during that time interval does not initiate an overcurrent trip process.

If the initial inrush current does not exceed the above criteria, the current through the secondary group of parallel connected MOS/FETs continues to be sensed while the MOS/FET is in a fully conducting state. Under normal operating conditions there is now a conduction path through the manual control switch 26 or 58 and the secondary relay switch K1 to the power contactor primary switch 20 or 60. The manual control switch 26 or 58 can be operated to control power applied through the secondary relay switch K1 to the primary contactor 20 or 60 to operate or turn off the motor.

Overcurrent Trip Process. The overcurrent trip process that is programmed in the microprocessor is initiated at any time an overcurrent is detected following the initial short time delay interval that accommodates the initial inrush current. The current actually read by the microprocessor is the current through the secondary MOS/FET which is the motor load current divided by the proportionality constant. So the stored overcurrent trip value is a selected motor overcurrent value divided by the proportionality constant. When an overcurrent is detected, power is removed from the coil 34 of relay K1 to open K1 in order to try to open the primary contactor 20 or 60. More specifically, a voltage is applied to the electrically controlled input of the secondary switch K1 that maintains the secondary switch K1 in its OFF state if the sensed current exceeds a selected value of overcurrent. The voltage applied to the secondary switch K1 is the nominal actuating voltage for the secondary switch K1 if the secondary switch K1 is the preferred normally closed switch (but would be 0 volts if the secondary switch K1 is a normally open relay switch).

Sensing of motor load current continues after secondary switch K1 is switched to its OFF state. If opening the relay K1 results in the primary switch 20 or 60 opening, motor load current will cease flowing. The microprocessor 32 is programmed to then enter a fault recovery time delay to prevent repeated rapid cycling of the primary switch 20 or 60 while the cause of the overcurrent continues to exist. For example, a simple time delay, typically 10 to 30 seconds, can be used much like a self-resetting circuit breaker.

However, if any motor load current is sensed after the secondary switch K1 is switched to its OFF state, the presence of that current means that the contacts of the primary switch 20 or 60 are welded closed. Upon sensing a motor load current after the secondary switch K1 is switched to its OFF state, the microprocessor 32 switches the MOS/FET 28 to its fully OFF state. In other words, a shut off voltage is applied to the gates (pin 1) of the MOS/FET to maintain the MOS/FET in a fully non-conducting state if a current is sensed after the secondary switch is switched to its OFF state. The microprocessor is programmed to then enter a circuit fault mode in which it remains until the control circuit 44 is depowered. Upon the eventual reapplication of power to the control circuit 44, the microprocessor initiates the initial safety check as described above.

A characteristic of the circuit of the invention is that the power MOS/FET is not operating in its conventional mode for modulating a load current. It is operating only as a current sensor when it is in its ON state. Because the MOS/FET is not switched to control motor current during normal motor operation, it is always in its lowest, near zero resistance state and therefore it is not a voltage dropping resistance in the power circuit and does not appreciably heat up or consume power.

Undervoltage/Overvoltage Shutdown. The circuit of the invention allows the microprocessor 32 to be programmed to check the battery voltage and prevent operation of the motor or other load if the battery voltage is too high or too low. With the MOS/FET 28 in its fully ON state, the voltage of the battery 18 will be the voltage at the main source terminal (pin 4) which is input to the microprocessor. Consequently, for a 12 volt battery system, if the battery voltage sensed by the microprocessor 32 is below a selected undervoltage, such as 7 volts, or is above a selected overvoltage, such as 16 volts, the microprocessor will not close the secondary switch, relay K1, and therefore prevents operation of the motor. Of course other selected overvoltage and undervoltage values will be used for other battery systems.

Advantages and Improvements. Embodiments of the invention are incredibly precise because, with a MOS/FET being used to monitor motor load current, the load current is not itself directly being measured. Instead, the current being sensed is a different current, a current through the secondary MOS/FET, which is related to the load current by the proportionality constant. With a MOS/FET, the proportionality constant that relates actual motor current to the sensed current does not vary with temperature. The reason is that the current through the secondary MOS/FET, which is the current that is actually being sensed, is always related to the load current through the main MOS/FET by the ratio of the number of MOS/FETs in the secondary MOS/FET to the number of MOS/FETs in the main MOS/FET. The number of MOS/FETs cannot vary as a function of temperature because that ratio is determined at the time of manufacture by the physical structure of the MOS/FET. The output of the current sensing MOS/FET is a small signal current, which can be passed through a resistor to develop a voltage that is proportional to the current. That voltage is converted to a digital value and compared to a stored digital value that represents the value of secondary MOS/FET current at the selected overcurrent value. The controller can be calibrated by applying a current at the overcurrent value to the main MOS/FET, measuring the current of the secondary MOS/FET and storing the measured secondary current as the overcurrent value of the secondary MOS/FET at the overcurrent trip current value.

In those circuits using a resistor in series in the power circuit and monitoring the voltage across that series resistor, the resistance of the resistor varies with temperature. That is particularly problematic because that resistor carries the load current which can vary considerably as a function of mechanical motor loading. Because the resistance of the resistor varies with temperature, the voltage across the resistor, and therefore the value of sensed current varies as a function of resistor temperature. The value of sensed current using a Hall effect device also varies as a function of temperature. So the prior art has a level of temperature dependent inaccuracy that the present invention does not have.

Another advantageous improvement of the invention is the dual function of the single MOS/FET device. If a series resistor or a Hall effect device is used to sense the power circuit current, neither the resistor nor the Hall effect can be used to open (interrupt) the power circuit in the event that the main contactor contacts become welded closed. However, use of the MOS/FET for current sensing in the manner described above simultaneously allows the same device to be used to open the power circuit if the main contacts of the main contactor become welded.

Embodiments of the invention can utilize a commercially available power MOS/FET such as a SENSEFET® Power MOS/FET, which allows connection of the individual MOS/FETs in separate groups in the manner described above and is sold by Semiconductor Components Industries, LLC. Its secondary MOS/FET is used to avoid destruction of the MOS/FET as a result of overcurrent through its main MOS/FET.

Figure 4:
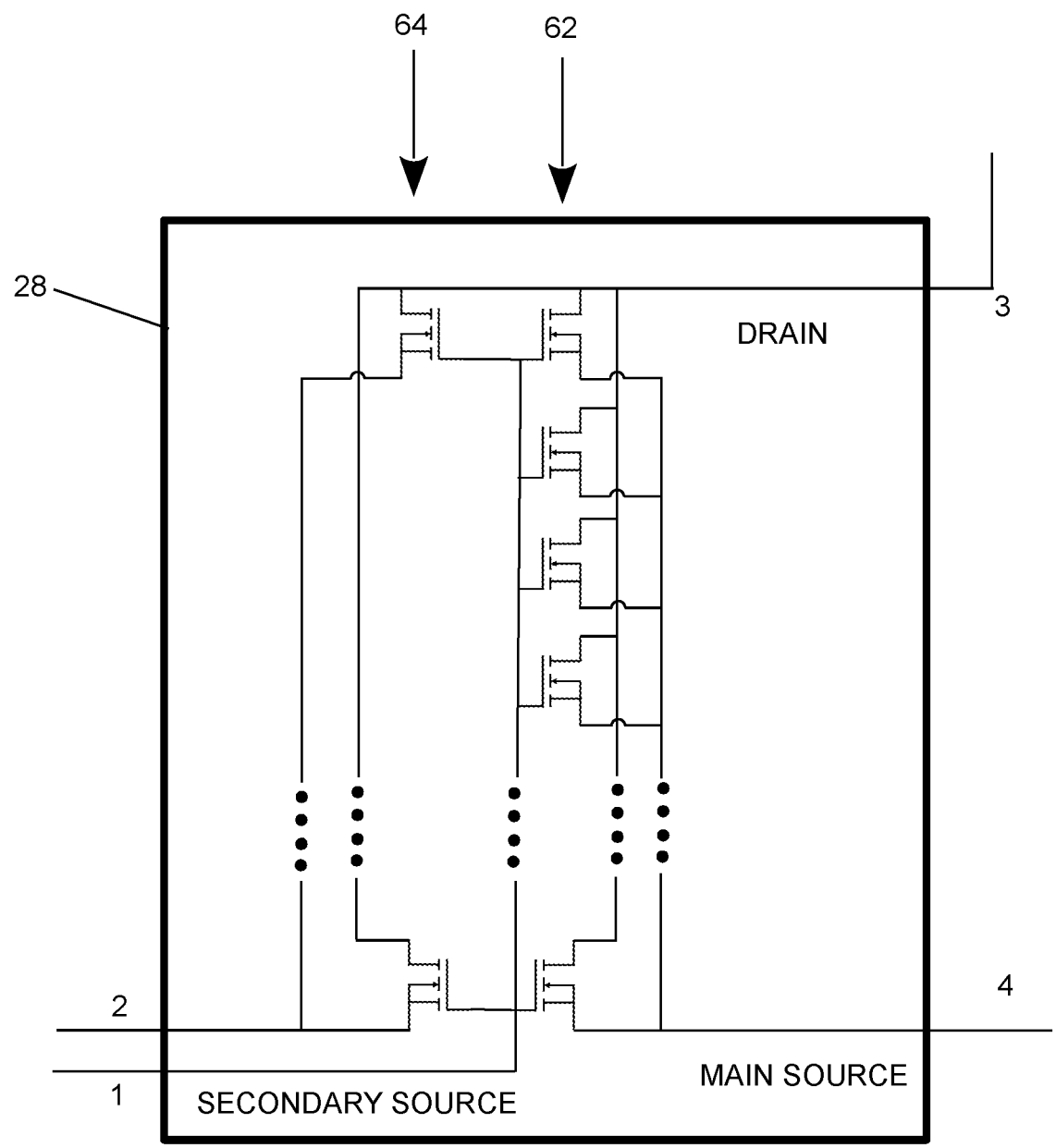
FIG. 4 is a schematic diagram of components of a power MOS/FET that is suitable for use in the invention.

FIG. 4 includes a more detailed schematic diagram that illustrates additional internal detail of the power MOS/FET 28 that is illustrated in FIGS. 1 and 3 and was previously described. In particular FIG. 4 shows a main group 62 of parallel connected MOS/FETs and a secondary group 64 of parallel connected MOS/FETs. In the schematic diagram of FIG. 4 those groups are aligned vertically in the drawing. Of course, as previously explained, each group has many parallel connected MOS/FETs, far too many than it is possible to include on a drawing. Consequently only a representative relatively few are shown and the existence of many more is indicated by the vertically aligned dots that represent the inclusion of more of the same MOS/FETs connected in the same manner in their respective groups as the illustrated MOS/FETs. The schematic of FIG. 4 shows a different number of MOS/FETs in each group to represent the previously described relationship between the number of MOS/FETs in each group.

REFERENCE NUMBERS protection circuit 10
conduction paths 12 and 14
dc motor 16
battery 18
primary switch—mechanical relay 20
electrically controlled input 22 to coil 24
coil 24
manually operated ON/OFF switch 26
power MOS/FET 28
voltage dropping resistor 30
microprocessor 32
secondary switch K1
actuating coil 34 of the secondary switch K1
input 36 to data processor 32 from secondary source terminal (pin 2)
current limiting resistor 38
regulator 40
terminal 42 to resistor 38
control circuit 44
output 46 to the coil 34
output 48 to the gates of the MOS/FET 28
input 50 from the main source (pin 4) to the microprocessor 32
charge pump 52
controlling input 54 of charge pump 52
output 56 of charge pump 52
manual control switch 58 (FIG. 3)
primary switch 60 (FIG. 3)
MOS/FET Terminals
gate terminal (pin 1)
secondary source terminal (pin 2)
drain terminal (pin 3)
main source terminal (pin 4)

This detailed description in connection with the drawings is intended principally as a description of the presently preferred embodiments of the invention, and is not intended to represent the only form in which the present invention may be constructed or utilized. The description sets forth the designs, functions, means, and methods of implementing the invention in connection with the illustrated embodiments. It is to be understood, however, that the same or equivalent functions and features may be accomplished by different embodiments that are also intended to be encompassed within the spirit and scope of the invention and that various modifications may be adopted without departing from the invention or scope of the following claims.

The invention claimed is:

1. A method for protecting a power circuit from an overcurrent, the power circuit including an electrical load in series connection with an electrical power source and a primary switch for controlling current through the load, the primary switch having an electrically controlled input for switching the primary switch between its ON state and its OFF state, the method comprising:
   (a) interposing a power metal-oxide-semiconductor field-effect transistor (MOS/FET) in series in the power circuit, the power MOS/FET having a main group of parallel connected MOS/FETs and a secondary group of parallel connected MOS/FETs, the groups having their gates connected together and having their drains connected together, the power MOS/FET being connected in series in the power circuit at the sources of the main group of parallel connected MOS/FETs and the drains, the number of parallel connected MOS/FETs in the main group being greater than the number of parallel connected MOS/FETs in the secondary group by a proportionality constant equal to or greater than 1;
   (b) applying a voltage to the gates that maintains the power MOS/FET in a fully conducting state;
   (c) sensing current through the secondary group of parallel connected MOS/FETs while the MOS/FET is in a fully conducting state; and
   (d) if the sensed current exceeds a selected value representing overcurrent through the main group of parallel connected MOS/FETs, applying a voltage to the gates that maintains the power MOS/FET in a fully non-conducting state.

2. A method for protecting a power circuit from an overcurrent, the power circuit including an electrical load in series connection with an electrical power source and a primary switch for controlling current through the load, the primary switch having an electrically controlled input for switching the primary switch between its ON state and its OFF state, the method comprising:
   (a) interposing a power MOS/FET in series in the power circuit, the power MOS/FET having a main group of parallel connected MOS/FETs and a secondary group of parallel connected MOS/FETs, the groups having their gates connected together and having their drains connected together, the power MOS/FET being connected in series in the power circuit at the sources of the main group of parallel connected MOS/FETs and the drains, the number of parallel connected MOS/FETs in the main group being greater than the number of parallel connected MOS/FETs in the secondary group by a proportionality constant greater than 1;
   (b) controlling the primary switch with a secondary switch (K1) interposed in series connection between the power source and the electrically controlled input of the primary switch, the secondary switch having an electrically controlled input for switching the secondary switch between its ON state and its OFF state;

(c) applying a voltage to the gates that maintains the power MOS/FET in a fully conducting state;
(d) sensing current through the secondary group of parallel connected MOS/FETs while the MOS/FET is in a fully conducting state;
(e) applying a voltage to the electrically controlled input of the secondary switch that maintains the secondary switch in its OFF state if the sensed current exceeds a selected value of overcurrent; and
(f) applying a shut off voltage to the gates of the MOS/FET to maintain the MOS/FET in a fully non-conducting state if a current is sensed after the secondary switch is in its OFF state.

3. The method in accordance with claim 2 wherein the method further comprises:
(a) before the step of applying a voltage to the gates to bring the power MOS/FET to a fully conducting state, applying a voltage to the gates to bring the power MOS/FET to a fully non-conducting state
(b) applying a reference voltage through a current limiting resistor to the sources of the main group of parallel connected MOS/FETs;
(c) before the step of applying a voltage to the gates to bring the power MOS/FET to a fully conducting state, sensing the voltage at the sources of the main group of parallel connected MOS/FETs; and
(d) delaying the step of applying a voltage to the gates to bring the power MOS/FET to a fully conducting state if the voltage sensed at the sources of the main group of parallel connected MOS/FETs is not the reference voltage.

4. The method in accordance with claim 3
(a) while the secondary switch is in its OFF state, sensing the voltage at the sources of the main group of MOS/FETs; and
(b) applying a voltage to the electrically controlled input of the secondary switch that maintains the secondary switch in its OFF state if the sensed voltage exceeds a selected overvoltage value or is less than a selected undervoltage value.

5. A protection circuit for protecting a power circuit that includes an electrical load in series connection with an electrical power source and a primary switch for controlling the current through the load, the primary switch having an electrically controlled input for switching the primary switch between its ON state and its OFF state, the protection circuit comprising:
(a) a power metal-oxide-semiconductor field-effect transistor (MOS/FET) having a main group of parallel connected MOS/FETs and a secondary group of parallel connected MOS/FETs, the groups having their gates connected together and having their drains connected together, the main group of parallel connected MOS/FETs having its sources and the drains connected in series in the power circuit, the number of parallel connected MOS/FETs in the main group being greater than the number of parallel connected MOS/FETs in the secondary group by a proportionality constant greater than 1;
(b) a current sensing circuit connected to the sources of the secondary group of parallel connected MOS/FETs;
(c) a secondary switch (K1) interposed in series connection between the power source and the electrically controlled input of the primary switch, the secondary switch having an electrically controlled input for switching the secondary switch between its ON state and its OFF state; and
(d) a control circuit including a programmable data processor and connected to the current sensing circuit, the electrically controlled input of the secondary switch (K1), the gates of the MOS/FET, and the sources of the secondary group of MOS/FETs, the control circuit being programmed to apply a voltage to the gates of the MOS/FET that brings the MOS/FET to its fully conducting state, to apply a voltage to the secondary switch that opens the secondary switch when the current through the current sensing circuit exceeds a selected value of overcurrent and to apply a shut off voltage to the gates of the MOS/FET to open circuit the MOS/FET if a current is sensed by the current sensing circuit after the voltage that opens the secondary switch is applied to the secondary switch.

6. The protection circuit in accordance with claim 5 wherein a manually operated control switch is interposed in series connection with the electrically controlled input of the secondary switch.

7. The protection circuit in accordance with claim 6 wherein the current sensing circuit further comprises a voltage dropping resistor connected in series with the sources of the secondary group of parallel connected MOS/FETs and a common ground and wherein the sources of the secondary group of parallel connected MOS/FETs are connected to an input to the programmable data processor for converting the voltage across the voltage dropping resistor to a digital sensed current value.

8. The protection circuit in accordance with claim 7 wherein the protection circuit further comprises:
(a) an input to the programmable data processor connected to the sources of the main group of parallel connected MOS/FETs;
(b) a current limiting resistor connected between a reference voltage source and the sources of the main group of parallel connected MOS/FETs for applying a reference voltage to the sources of the main group of parallel connected MOS/FETs for testing the state of components of the power circuit; and
(c) the programmable data processor is programmed to initially apply a voltage to the gates to bring the power MOS/FET to a fully non-conducting state, sense the voltage at the sources of the main group of parallel connected MOS/FETs and apply a voltage to the gates to bring the power MOS/FET to a fully conducting state only if the voltage sensed at the sources of the main group of parallel connected MOS/FETs is the reference voltage.

9. The protection circuit in accordance with claim 8 wherein the power source is a dc source, the primary switch is a mechanical relay and the load is a dc motor.

10. The protection circuit in accordance with claim 9 wherein a charge pump circuit is connected to and controlled by the programmable data processor and has its output connected to the gate of the main group of parallel connected MOS/FETs for applying a gate to source voltage to the MOS/FET.

* * * * *